(12) United States Patent
Liu et al.

(10) Patent No.: US 9,012,999 B2
(45) Date of Patent: Apr. 21, 2015

(54) SEMICONDUCTOR DEVICE WITH AN INCLINED SOURCE/DRAIN AND ASSOCIATED METHODS

(75) Inventors: Qing Liu, Guilderland, NY (US); Prasanna Khare, Schenectady, NY (US); Nicolas Loubet, Guilderland, NY (US)

(73) Assignee: STMicroelectronics, Inc., Coppell, TX (US)

( * ) Notice: Subject to any disclaimer, the term of this patent is extended or adjusted under 35 U.S.C. 154(b) by 107 days.

(21) Appl. No.: 13/590,548

(22) Filed: Aug. 21, 2012

(65) Prior Publication Data

US 2014/0054715 A1    Feb. 27, 2014

(51) Int. Cl.
*H01L 21/336* (2006.01)
*H01L 21/8238* (2006.01)
*H01L 21/70* (2006.01)
*H01L 21/8234* (2006.01)

(52) U.S. Cl.
CPC *H01L 21/823814* (2013.01); *H01L 21/823425* (2013.01); *H01L 21/823864* (2013.01)

(58) Field of Classification Search
CPC .................. H01L 21/28562; H01L 21/76897; H01L 21/823807; H01L 21/823814; H01L 21/823835; H01L 21/823842; H01L 21/823871; H01L 21/823878; H01L 21/84; H01L 27/1203; H01L 29/045; H01L 29/47; H01L 29/665
USPC .................................................. 257/368–401
See application file for complete search history.

(56) References Cited

U.S. PATENT DOCUMENTS

| 6,548,875 | B2 * | 4/2003 | Nishiyama | 257/377 |
|---|---|---|---|---|
| 8,101,489 | B2 | 1/2012 | Shue et al. | |
| 8,120,185 | B2 | 2/2012 | Yang | |
| 8,134,208 | B2 | 3/2012 | Shi et al. | |
| 8,187,975 | B1 | 5/2012 | Khare et al. | |
| 2004/0262650 | A1 * | 12/2004 | Iwata et al. | 257/288 |
| 2008/0096358 | A1 | 4/2008 | Lee et al. | |
| 2009/0289279 | A1 | 11/2009 | Khare | |
| 2014/0001561 | A1 * | 1/2014 | Cheng et al. | 257/369 |

* cited by examiner

*Primary Examiner* — Amar Movva
*Assistant Examiner* — Cory Eskridge
(74) *Attorney, Agent, or Firm* — Allen, Dyer, Doppelt, Milbrath & Gilchrist, P.A.

(57) ABSTRACT

A semiconductor device includes a semiconductor substrate having a channel region therein, a gate structure above the channel region, and source and drain regions on opposite sides of the gate structure. A respective contact is on each of the source and drain regions. At least one of the source and drain regions has an inclined upper contact surface with the respective contact. The inclined upper contact surface has at least a 50% greater area than would a corresponding flat contact surface.

17 Claims, 6 Drawing Sheets

SEMICONDUCTOR DEVICE WITH AN INCLINED SOURCE/DRAIN AND ASSOCIATED METHODS

FIELD OF THE INVENTION

The present invention relates to the field of semiconductor devices, and more particularly, to a semiconductor device with a reduced contact resistance between a contact and a source/drain region, and related methods.

BACKGROUND OF THE INVENTION

Semiconductor devices, such as semiconductor integrated circuits (ICs), include numerous semiconductor device structures. Example semiconductor device structures are interconnected complementary metal oxide semiconductor (CMOS) transistors, which include both P-channel and N-channel MOS transistors. Interconnectivity between various device structures is accomplished by metalized contacts forming interlayer connections between the device structures.

Semiconductor device structures, including CMOS transistors, are being designed to have smaller and smaller feature sizes (e.g., gate structures). Based on this trend, as the gate pitch becomes smaller, the contacts that connect the source/drain regions of the transistor with metalized contacts also become smaller. As the contacts decrease in size, there is an increase in contact resistance. Contact resistance, which is decided by contact area and sheet resistivity, is becoming a limiting factor in further device performance improvement.

One approach to reduce contact resistance is disclosed in U.S. Pat. No. 8,101,489. A semiconductor substrate having doped regions is provided. A pre-amorphous implantation process and neutral (or non-neutral) species implantation process is performed over the doped regions. Subsequently, a silicide is formed in the doped regions. By conducting a pre-amorphous implantation combined with a neutral species implantation, the contact resistance between the silicide contact area and source/drain substrate interface is reduced.

Another approach to reduce contact resistance is disclosed in U.S. Pat. No. 8,134,208. A semiconductor device includes a semiconductor device structure and a contact, and the contact is electrically and physically coupled to the semiconductor device structure at both a surface portion and a sidewall portion of the semiconductor device structure.

While the above approaches may be effective in reducing contact resistance, further improvements may be desired.

SUMMARY OF THE INVENTION

In view of the foregoing background, it is therefore an object of the present invention to provide a semiconductor device with a reduced contact resistance that is readily manufactured.

This and other objects, features, and advantages in accordance with the present invention are provided by a semiconductor device comprising a semiconductor substrate having a channel region therein, a gate structure above the channel region, and source and drain regions on opposite sides of the gate structure. A respective contact may be on each of the source and drain regions. At least one of the source and drain regions may have an inclined upper contact surface with the respective contact.

The inclined upper contact surface may advantageously be formed using an additional etching step on the source and drain regions, with the etching step being self-limiting on tight pitch devices. This may advantageously provide better control of the upper contact surface for device optimization. Source and drain implantation may be performed after the additional etching step.

The inclined upper contact surface may be inclined downwardly away from the gate structure, and the incline may be at an angle in a range of 30-45 degrees. The inclined upper contact surface may have at least a 50% greater area than would a corresponding flat contact surface.

The source and drain regions may comprise respective raised source and drain regions. The raised source and drain regions may be provided by an epitaxial layer formed on the semiconductor substrate. The gate structure may comprise a gate stack and at least one sidewall spacer on opposite sides of the gate stack.

Another aspect is directed to a method for making a semiconductor device as described above. The method may comprise providing a semiconductor substrate having a channel region therein, forming a gate structure above the channel region, forming source and drain regions on opposite sides of the gate structure, and forming a respective contact on each of the source and drain regions. At least one of the source and drain regions has an inclined upper contact surface with the respective contact.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
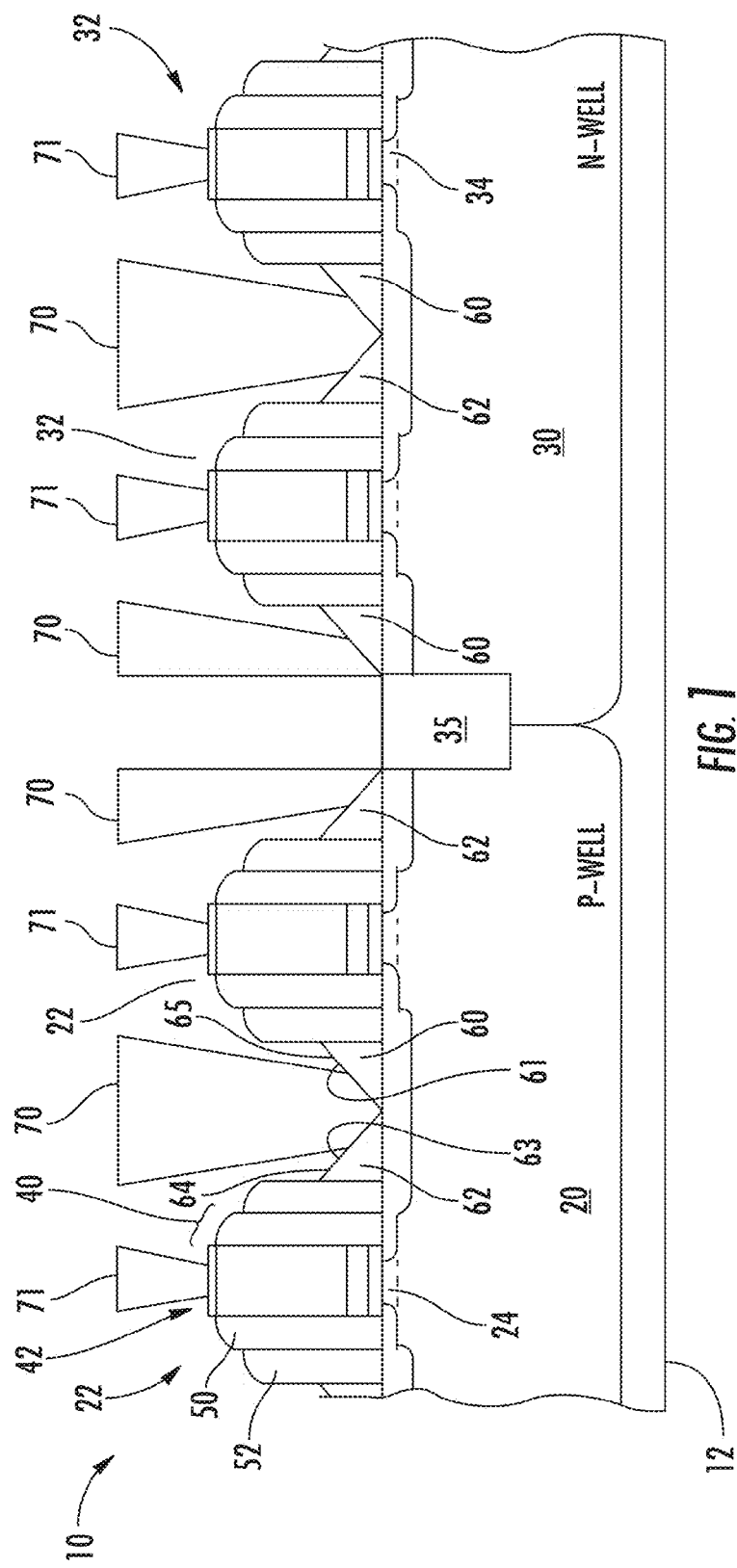
FIG. 1 is a cross-sectional view of semiconductor devices with inclined contacts in accordance with the present invention.

Referring initially to FIG. 1, the illustrated semiconductor device 10 is a complementary metal oxide semiconductor (CMOS) semiconductor device. The semiconductor device 10 includes a semiconductor substrate 12 with at least one p-well 20 and at least one n-well 30 separated by a shallow trench isolation (STI) region 35. The p-well 20 is for n-channel transistors 22, whereas the n-well 30 is for p-channel transistors 32.

Each p-channel transistor 32 includes a p-channel region 34 in the semiconductor substrate 12. Similarly, each n-channel transistor 22 includes an re-channel region 24 in the semiconductor substrate 12. Respective gate structures 40 are above the p-channel regions 34 and the n-channel regions 24. Each gate structure 40 includes a gate stack 42 and at least one pair of sidewall spacers 50, 52 on opposite sides of the gate stack.

Source and drain regions 60, 62 are on opposite sides of each gate structure 40. As will be discussed in greater detail below, the source and drain regions 60, 62 may be raised. A respective contact 70 is on each of the source and drain regions 60, 62. To reduce contact resistance between the contacts 70 and the source and drain regions 60, 62, the upper contact surfaces 61, 63 of the source/drain regions are inclined with the respective contacts 70.

The inclined upper contact surface 61, 63 as illustrated is inclined downwardly away from the gate structure 40. The illustrated inclined upper contact surface 61, 63 is inclined at an angle in a range of 30-45 degrees. The inclined upper contact surface 61, 63 may have at least a 50% greater area than would a corresponding flat contact surface. The larger the area the lower the contact resistance.

As will be discussed in greater detail below, the inclined upper contact surface may advantageously be performed using an additional etching step on the source and drain regions, with the etching step being self-limiting on tight pitch devices. This advantageously provides better control of the upper contact surface for device optimization. Source and drain implantation may be performed after the additional etching step.

Figure 2:
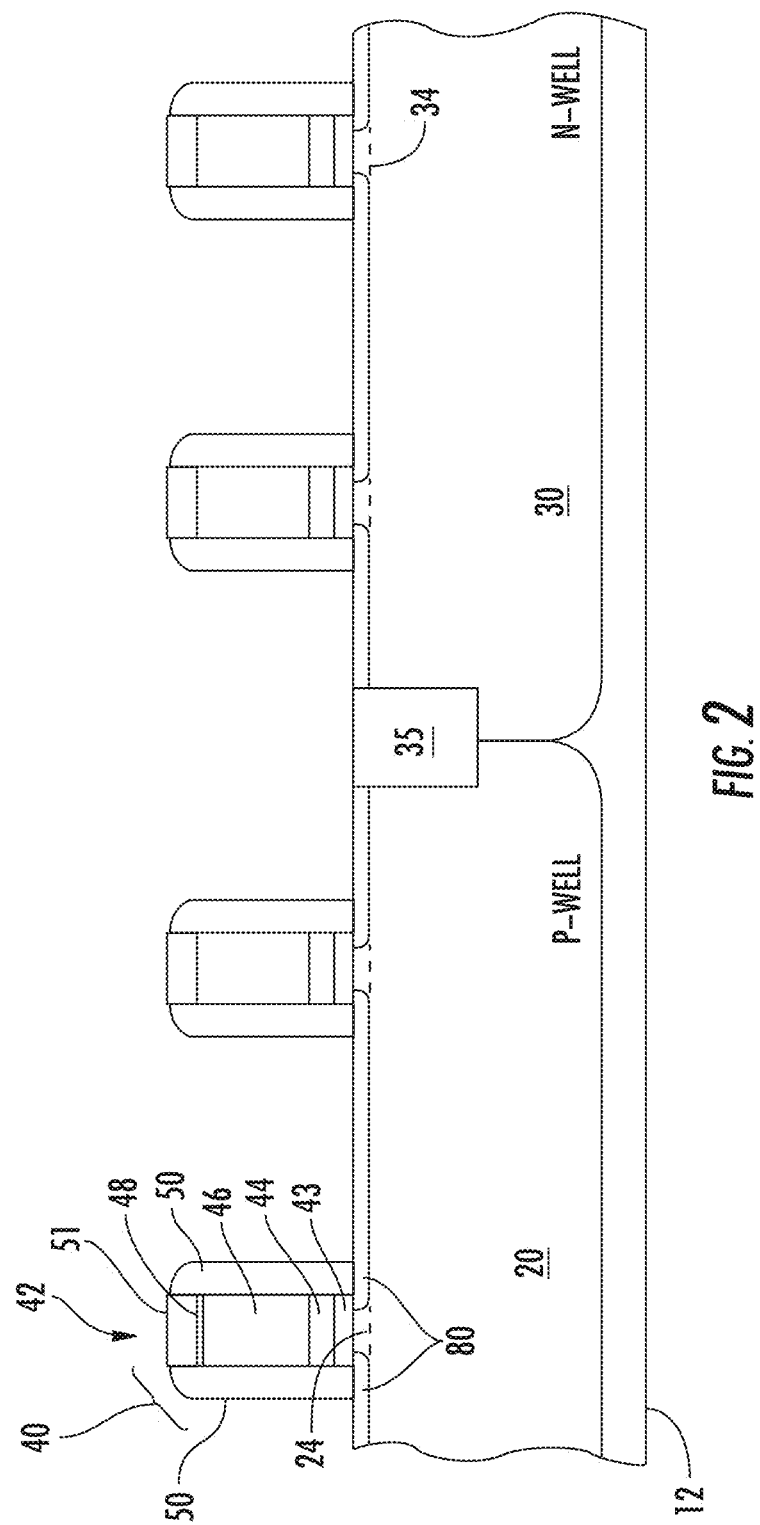
FIGS. 2-4 are cross-sectional views of a portion of the semiconductor devices shown FIG. 1 illustrating the process steps for making the same.
Figure 3:
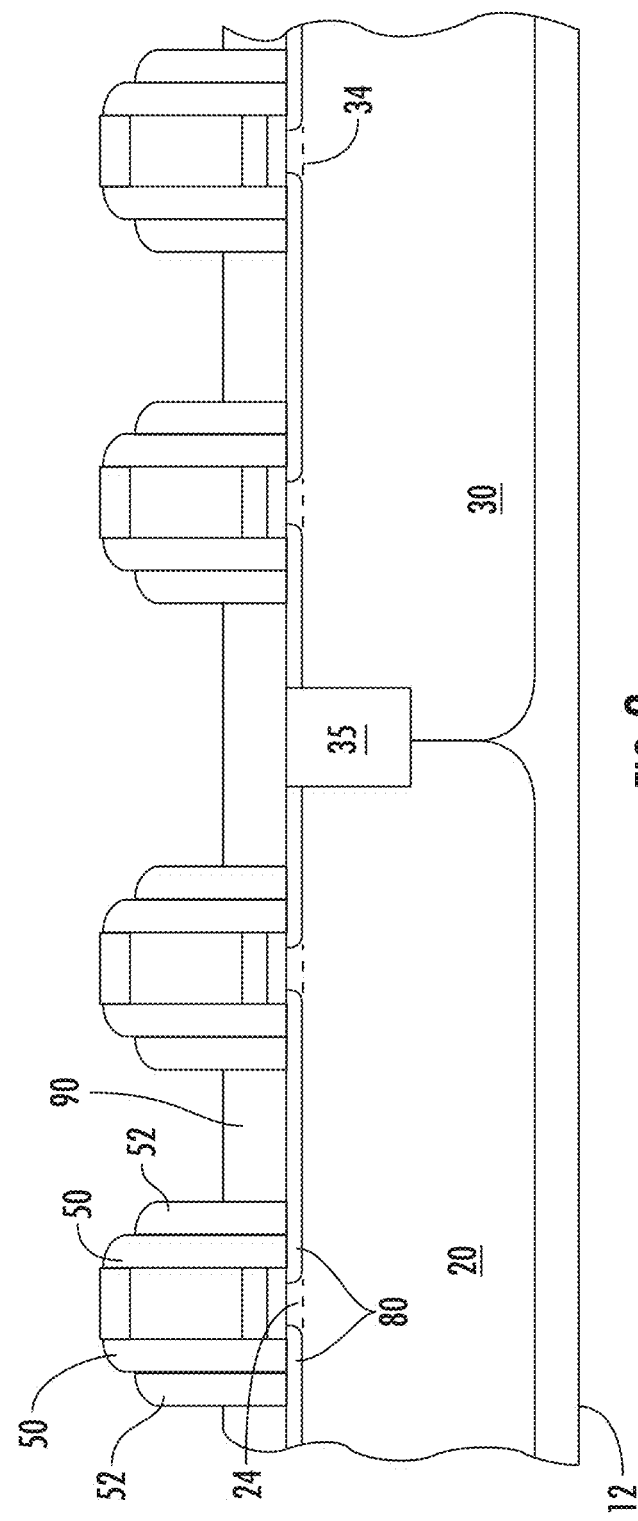
Figure 4:
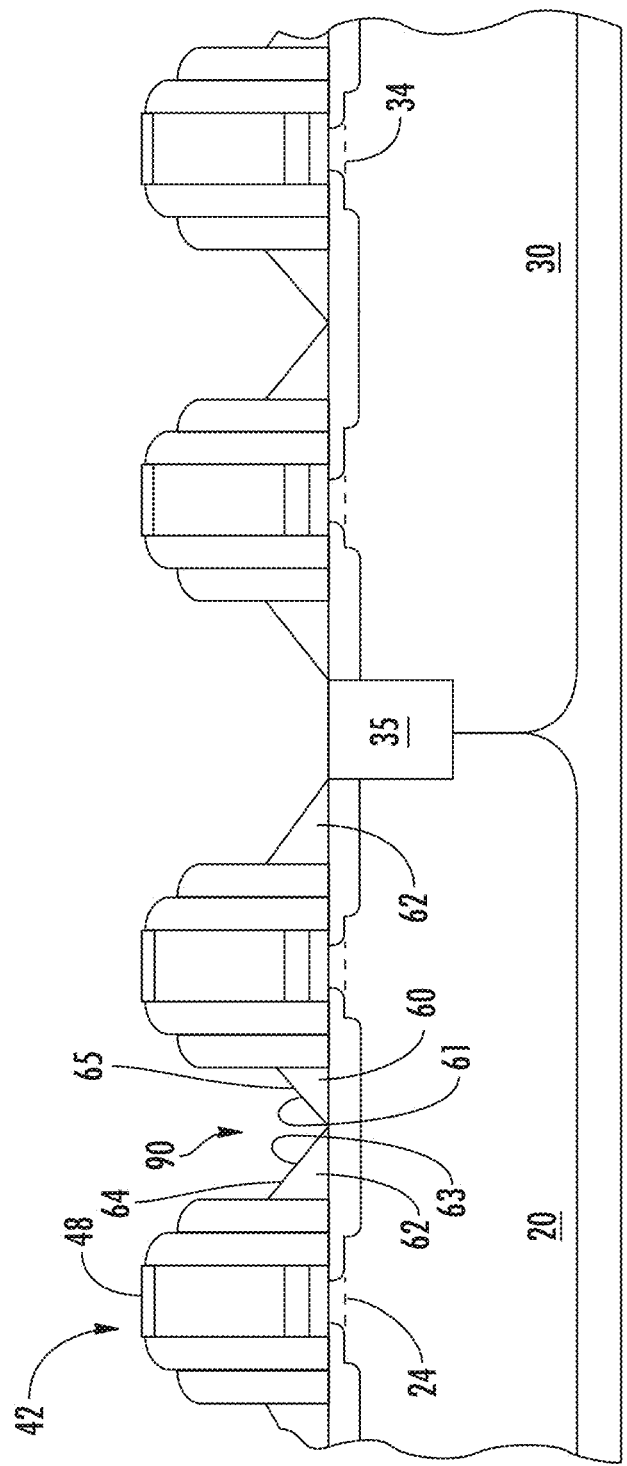

Referring now to FIGS. 2-4, the process steps for forming the CMOS semiconductor device 10 as described above will now be discussed. The shallow trench isolation region 35 is formed in the semiconductor substrate 12, and the p-well 20 and n-well 30 are respectively doped, as show in FIG. 2.

Gate structures 40 are formed on the semiconductor substrate 12. Each gate structure 40 includes a gate stack 42 and at least one sidewall spacer 50 on opposite sides of the gate stack. The gate stack 42 includes an oxide layer 43, a gate dielectric 44 on the oxide layer, a conductive layer 46 on the dielectric layer, and a silicide layer 48 on the conductive layer. The first pair of sidewall spacers 50 protects the gate structure 40. The first pair of spacers 50 may be silicon nitride, for example. A hard mask spacer 51 is also formed on the silicide layer 48.

After formation of the first pair of sidewall spacers 50, lightly doped drain/source extension regions 80 are formed on each side of the channel regions 24, 34. As would be readily appreciated by those skilled in the art, the lightly doped extension regions typically reduce the electric field near the channel regions 24, 34 and thus the hot-carrier reliability of the transistors is improved. The extension regions 80 reduce the electric field by effectively dropping a portion of the source/drain voltages across the extension regions.

After formation of the extension regions 80, a second pair of sidewall spacers 52 is formed, as illustrated in FIG. 3. As will be readily appreciated by those skilled in the art, the second pair of sidewall spacers 52 allows a heavier implantation dose to be performed while reducing the punchthrough effect between the source and drain regions 60, 62.

The source and drain regions 60, 62 as illustrated in FIG. 1 are raised. Still referring to FIG. 3, this is accomplished by growing an epitaxial layer 90 on the substrate 12. Alternatively, the source and drain regions 60, 62 may be formed without being raised.

Referring now to FIG. 4, the hard mask spacers 51 above the gates stacks 42 are removed. The epitaxial layer 90 is etched to form the inclined upper contact surfaces 61, 63 for corresponding source and drain regions 60, 62. As readily appreciated by those skilled in the art, the etching may be a wet etch or a dry etch. An example etch uses hydrochloric acid (HCL), for example. The epitaxial layer 90 has a <100> plane but after the etching it becomes a <111> plane, as also readily appreciated by those skilled in the art.

Due to the pitch of the gate stacks 42, the etching step may be self-limiting on tight pitch devices. This advantageously provides better control of the upper contact surfaces 61, 63 for device optimization. As noted above, the inclined upper contact surfaces 61, 63 may be inclined downwardly away from the gate stack 42, and the incline may be at an angle in a range of 30-45 degrees. The inclined upper contact surfaces 61, 63 may have at least a 50% greater area than would corresponding flat contact surfaces.

After the etching step, source and drain implantations are performed. This may be followed by a rapid thermal anneal to activate the dopants from the implantation. Next, silicide 64, 65 may be formed on the inclined upper contact surfaces 61, 63, as illustrated in FIG. 4. Contacts 70 may then be formed on the source and drain regions 60, 62 and contacts 71 may be formed on the gate stacks 42, as initially illustrated in FIG. 1.

Figure 5:
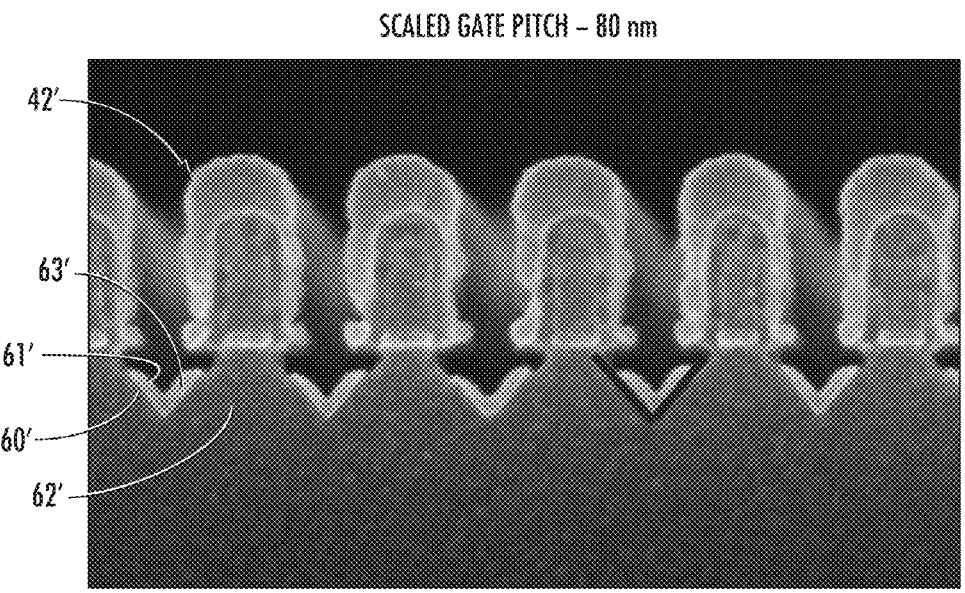
FIG. 5 is an image of a cross-sectional view of semiconductor devices with inclined contacts and having an 80 nm gate pitch in accordance with the present invention.

As noted above, the source and drain regions 60, 62 may be formed without being raised. As best illustrated in FIG. 5, the source and drain regions 60', 62' are formed in the semiconductor substrate 12'. The upper contact surfaces 61', 63' are still inclined downwardly away from the gate stack 42'. The pitch between the gate stacks 42' is 80 nm, which in turn is self-limiting to the etching step.

Figure 6:
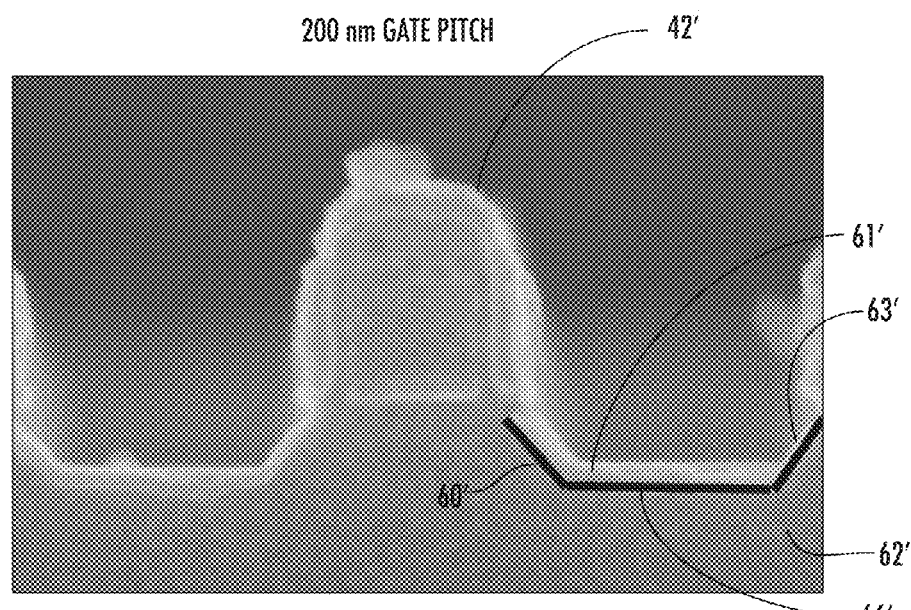
FIG. 6 is an image of a cross-sectional view of a semiconductor device with inclined contacts and having a 200 nm gate pitch in accordance with the present invention.

As the pitch between the gate stacks 42' increases, the pitch is not as self-limiting. As illustrated in FIG. 6, the gate pitch is 200 nm. The upper contact surfaces 61', 63' are still inclined downwardly away from the gate stack 42' but there is now a flat surface 66' between the inclined upper contact surfaces.

Figure 7:
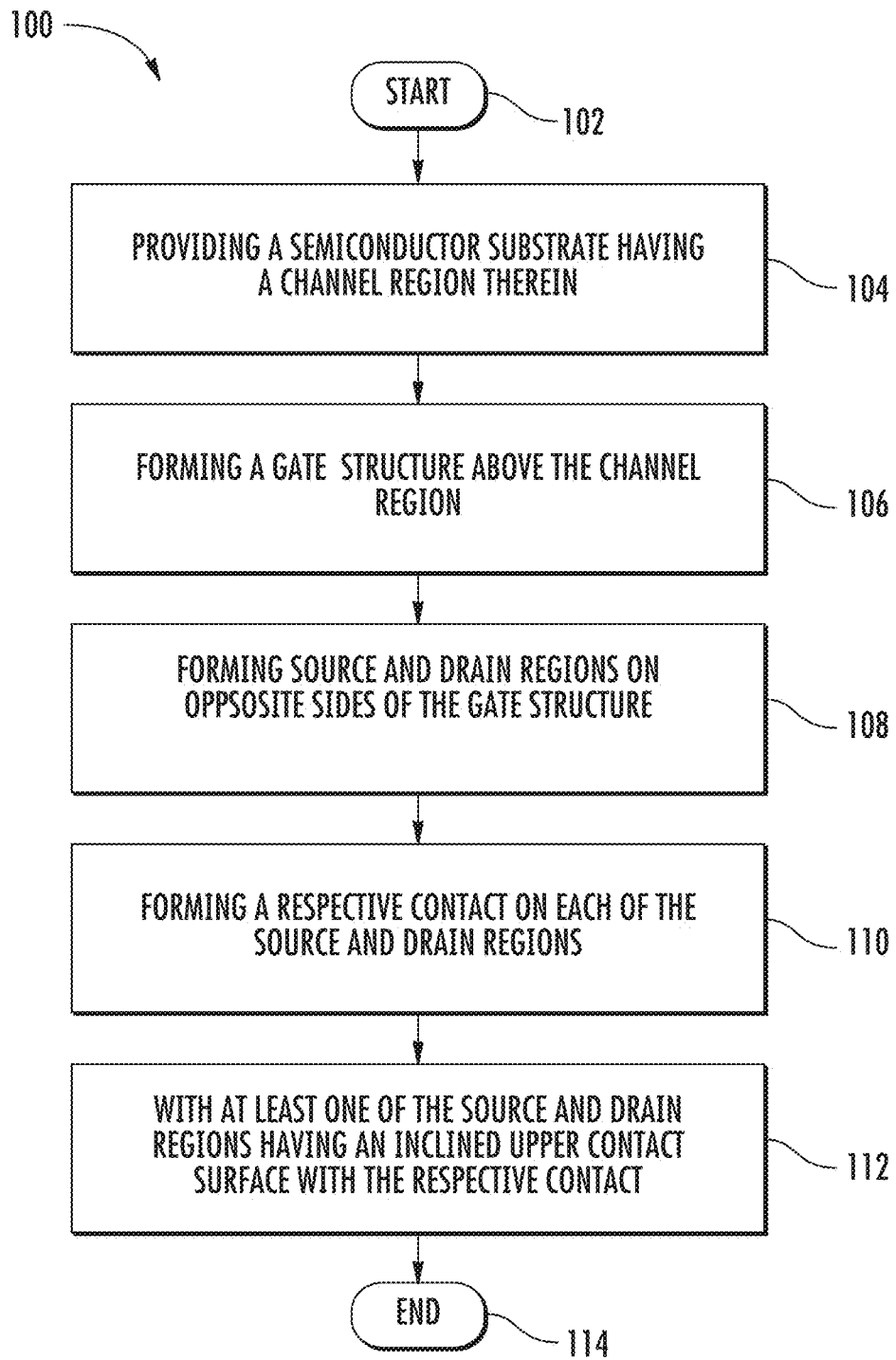
FIG. 7 is a flowchart illustrating a method for making a semiconductor device in accordance with the present invention.

Referring now to the flowchart 100 illustrated in FIG. 7, a method for making a semiconductor device 10 as described above will now be discussed. From the start (Block 102), the method comprises providing a semiconductor substrate 12 having a channel region 24 therein at Block 104, and forming a gate structure 40 above the channel region at Block 106. At Block 108, source and drain regions 60, 62 are formed on opposite sides of the gate structure 40. A respective contact 70 is formed on each of the source and drain regions 60, 62 at Block 110. At least one of the source and drain regions 60, 62 has an inclined upper contact surface 61, 63 with the respective contact 70 as provided at Block 112. The method ends at Block 114.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:
1. A semiconductor device comprising:
   a semiconductor substrate having a channel region therein and at least one isolation region therein adjacent the channel region;
   a gate structure above the channel region;
   raised source and drain regions on opposite sides of said gate structure and having a bottom contacting said semiconductor substrate without overlapping the at least one isolation region; and
   a respective contact on each of said raised source and drain regions;

at least one of said raised source and drain regions having a substantially vertical sidewall contacting a substantially vertical sidewall of said gate structure and an inclined upper contact surface with said respective contact, with the inclined upper contact surface in contact with said gate structure.

2. The semiconductor device according to claim 1 wherein the inclined upper contact surface is inclined downwardly away from said gate structure.

3. The semiconductor device according to claim 1 wherein the inclined upper contact surface is inclined at an angle in a range of 30-45 degrees.

4. The semiconductor device according to claim 1 wherein the inclined upper contact surface has at least a 50% greater area than would a corresponding flat contact surface.

5. The semiconductor device according to claim 1 wherein said gate structure comprises a gate stack and at least one sidewall spacer on opposite sides of said gate stack.

6. The semiconductor device according to claim 5 wherein said gate stack comprises a dielectric layer adjacent the channel region and a conductive layer on said dielectric layer.

7. A complementary metal oxide semiconductor (CMOS) semiconductor device comprising:
   a semiconductor substrate having at least one isolation region therein, and a p-channel region and an n-channel region therein, with the p-channel and n-channel regions being separated by the at least one isolation region;
   a respective gate structure above the p-channel region and the n-channel region;
   respective raised source and drain regions on opposite sides of each gate structure and having a bottom contacting said semiconductor substrate without overlapping the at least one isolation region; and
   a respective contact on each of said raised source and drain regions;
   at least one of said raised source and drain regions having a substantially vertical sidewall contacting a substantially vertical sidewall of said respective gate structure and an inclined upper contact surface with said respective contact, with the inclined upper contact surface in contact with said gate structure and inclined downwardly away from said gate structure at an angle in a range of 30-45 degrees.

8. The CMOS semiconductor device according to claim 7 wherein the inclined upper contact surface has at least a 50% greater area than would a corresponding flat contact surface.

9. The CMOS semiconductor device according to claim 7 wherein each gate structure comprises a gate stack and at least one sidewall spacer on opposite sides of said gate stack.

10. The CMOS semiconductor device according to claim 9 wherein each gate stack comprises a dielectric layer adjacent the channel region and a conductive layer on said dielectric layer.

11. A method for making a semiconductor device comprising:
    providing a semiconductor substrate having a channel region therein and at least one isolation region therein adjacent the channel region;
    forming a gate structure above the channel region;
    forming raised source and drain regions on opposite sides of the gate structure and having a bottom contacting the semiconductor substrate without overlapping the at least one isolation region; and
    forming a respective contact on each of the raised source and drain regions;
    with at least one of the raised source and drain regions having a substantially vertical sidewall contacting a substantially vertical sidewall of the gate structure and an inclined upper contact surface with the respective contact, and with the inclined upper contact surface in contact with said gate structure.

12. The method according to claim 11 wherein forming the inclined upper contact surface comprises an etching step.

13. The method according to claim 11 wherein the inclined upper contact surface is inclined downwardly away from the gate structure.

14. The method according to claim 11 wherein the inclined upper contact surface is inclined at an angle in a range of 30-45 degrees.

15. The method according to claim 11 wherein forming the respective raised source and drain regions comprising forming an epitaxial layer on the semiconductor substrate.

16. The method according to claim 11 wherein the inclined upper contact surface has at least a 50% greater area than would a corresponding flat contact surface.

17. The method according to claim 11 wherein the gate structure comprises a gate stack and at least one sidewall spacer on opposite sides of the gate stack.

* * * * *